(12) United States Patent
Chen et al.

(10) Patent No.: US 10,170,512 B2
(45) Date of Patent: Jan. 1, 2019

(54) UNIFORM-SIZE BONDING PATTERNS

(71) Applicant: Taiwan Semiconductor Manufacturing Company, Ltd., Hsin-Chu (TW)

(72) Inventors: Szu-Ying Chen, Toufen Township (TW); Dun-Nian Yaung, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 437 days.

(21) Appl. No.: 15/207,031

(22) Filed: Jul. 11, 2016

(65) Prior Publication Data
US 2016/0322414 A1  Nov. 3, 2016

Related U.S. Application Data

(62) Division of application No. 14/229,159, filed on Mar. 28, 2014, now Pat. No. 9,391,109.

(51) Int. Cl.
*H01L 27/146* (2006.01)

(52) U.S. Cl.
CPC .... *H01L 27/14636* (2013.01); *H01L 27/1464* (2013.01); *H01L 27/1469* (2013.01); *H01L 27/14621* (2013.01); *H01L 27/14627* (2013.01); *H01L 27/14629* (2013.01); *H01L 27/14634* (2013.01); *H01L 27/14643* (2013.01); *H01L 27/14685* (2013.01); *H01L 27/14689* (2013.01)

(58) Field of Classification Search
CPC ........... H01L 23/49816; H01L 23/3128; H01L 23/481; H01L 23/49811; H01L 23/49827; H01L 23/3114; H01L 23/5389; H01L 23/3192; H01L 23/3107; H01L 23/3171; H01L 23/49822; H01L 23/49838; H01L 23/53238; H01L 27/14621; H01L 27/14627; H01L 27/14629; H01L 27/14636; H01L 27/1464; H01L 27/14643; H01L 27/14685; H01L 27/14689; H01L 27/1469
USPC ............................ 257/40, 55, 232, 432, 723
See application file for complete search history.

(56) References Cited

U.S. PATENT DOCUMENTS

| | | | |
|---|---|---|---|
| 2008/0203452 A1* | 8/2008 | Moon | H01L 27/14603 257/292 |
| 2013/0100391 A1 | 4/2013 | Wang et al. | |
| 2014/0035137 A1* | 2/2014 | Kwon | H01L 23/562 257/738 |

* cited by examiner

*Primary Examiner* — Joseph M Galvin, III
(74) *Attorney, Agent, or Firm* — Slater Matsil, LLP

(57) ABSTRACT

A semiconductor device, and a method of fabrication, is introduced. In an embodiment, one or more passivation layers are formed over a first substrate. Recesses are formed in the passivation layers and a first plurality of bonding pads and a second plurality of bonding pads are formed in the recesses. In an embodiment, the first plurality of bonding pads have a first width and a first pitch, and the second plurality of bonding pads have the first width and are grouped into clusters. The first plurality of bonding pads and the second plurality of bonding pads in the first substrate are aligned to a third plurality of bonding pads in a second substrate and are bonded using a direct bonding method.

20 Claims, 6 Drawing Sheets

UNIFORM-SIZE BONDING PATTERNS

This application is a divisional of U.S. patent application Ser. No. 14/229,159, entitled "Uniform-Size Bonding Patterns," filed on Mar. 28, 2014, which application is hereby incorporated herein by reference.

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers/dies, and active circuits such as logic, memory, processor circuits and the like located on different semiconductor wafers/dies. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers/dies are bonded together, the interface between two semiconductor wafers/dies may provide an electrically conductive path between the stacked semiconductor wafers/dies.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
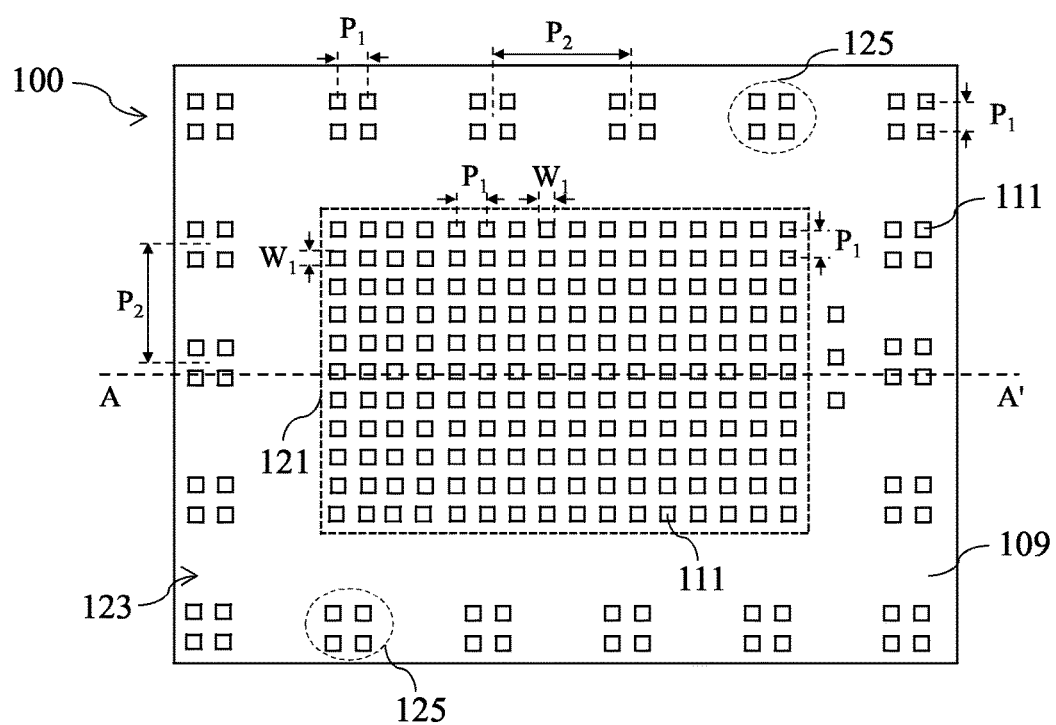
FIGS. 1A-3 are cross-sectional views illustrating method of forming of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a pattern of hybrid bonding pads for wafer/die bonding. Hereinafter, various embodiments will be explained in detail with reference to the accompanying drawings.

Figure 1B:
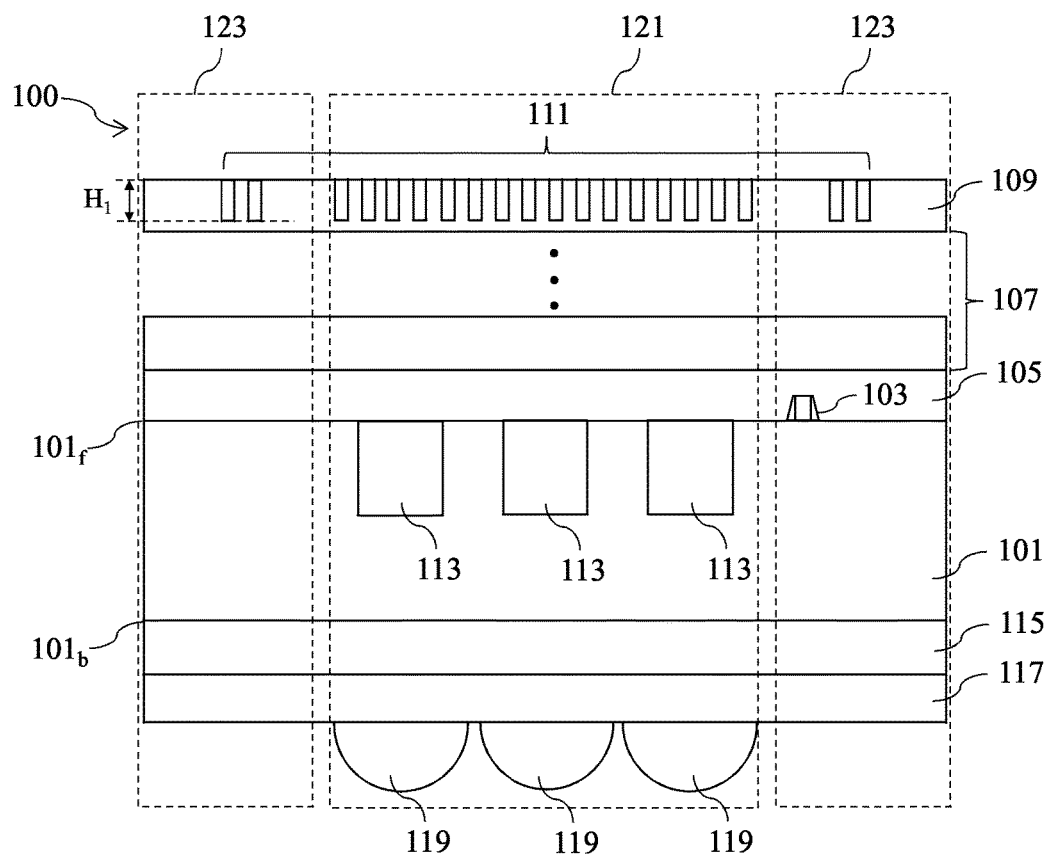

With reference to FIGS. 1A and 1B, there are shown top and cross-sectional views (through the line AA' in FIG. 1A), respectively, of a first semiconductor device 100 in accordance with some embodiments. In some embodiments, the first semiconductor device 100 is a backside-illuminated (BSI) CMOS image sensor (CIS). In other embodiments, the first semiconductor device 100 may be a die/chip or a wafer manufactured using a CMOS process, a MEMS process, or any suitable process according to specifications of the first semiconductor device 100.

Referring to FIG. 1B, in the embodiments with the first semiconductor device 100 being a BSI CIS, the first semiconductor device 100 comprises a first substrate 101. The first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

An array of photosensitive elements 113 is formed in the first substrate 101 as illustrated in FIG. 1B. The photosensitive elements 113, such as photo-diodes are formed, for example, by implanting impurity ions into the first substrate 101. Furthermore, the photosensitive elements 113 may be a PN junction photo-diode, a PNP photo-transistor, an NPN photo-transistor or the like. In some embodiments, the photosensitive elements 113 may be separated from each other by isolation regions (not shown), such as shallow trench isolation (STI) regions, suitably doped wells formed by ion-implantation, and the like.

A bottom anti-reflective coating (BARC) structure 115 is formed on a backside 101$_b$ of the first substrate 101 as illustrated in FIG. 1B. In the illustrated embodiment, the BARC structure 115 may comprise one or more layers of dielectric materials, such as silicon oxide, hafnium oxide (HfO$_2$), tantalum oxide (Ta$_2$O$_5$), and the like. The BARC structure 115 may be formed by any acceptable process, such as CVD or the like.

Referring further to FIG. 1B, a color filter layer 117 is formed below the BARC structure 115. In some embodiments, the color filter layer 117 comprises, for example, a silicon oxide layer with color filters (not individually shown) formed therein. The color filters may be used to allow specific wavelengths of light to pass while reflecting other wavelengths, thereby allowing the BSI CIS to determine the color of the light being received by the photosensitive elements 113. The color filters may vary, such as being a red, green, and blue filter as used in a Bayer pattern. Other combinations, such as cyan, yellow, and magenta, may also be used. The number of different colors of the color filters may also vary. The color filters may comprise a polymeric material or resin, such as a polymeric polymer, polymethyl-methacrylate (PMMA), polyglycidyl-methacrylate (PGMA), or the like, that includes colored pigments. In some embodiments, reflective guide layers (not shown) are formed along sidewalls of the color filters. The reflective guide layers are formed of a metal or other high refractive index material that is capable of reflecting light, such as copper, aluminum, tantalum nitride, titanium nitride, tungsten, silicon nitride, the like, or a combination thereof.

An array of microlenses 119 are formed below the color filter layer 117 as illustrated in FIG. 1B. In some embodiments, the microlenses 119 are aligned with respective color filters in the color filter layer 117 and the photosensitive elements 113 in the first substrate 101. The microlenses 119 may be formed of any material that may be patterned and formed into lenses, such as a high transmittance acrylic polymer. In an embodiment, a microlens layer may be formed using a material in a liquid state by, for example, spin-on techniques. Other methods, such as deposition techniques like CVD, PVD, or the like, may also be used. The planar material for the microlens layer may be patterned using photolithography and etch techniques to pattern the planar material in an array corresponding to the array of the photosensitive elements 113. The planar material may then be reflowed to form an appropriate curved surface for the microlenses 119, and the microlenses 119 can be cured using a UV treatment.

In addition to the photosensitive elements 113, devices 103 are formed on the first substrate 101 of the first semiconductor device 100. The devices 103 are represented in FIG. 1A as a single transistor. However, the devices 103 may comprise a wide variety of active and/or passive devices such as transistors, diodes, capacitors, resistors, inductors and the like, which may be used to generate the desired structural and functional requirements of the design for the first semiconductor device 100. The devices 103 may be formed using any suitable methods either within or on the surface of the first substrate 101, or in an overlying dielectric layer. One of ordinary skill in the art will appreciate that the above examples are provided for illustrative purposes only to further explain applications of some illustrative embodiments and are not meant to limit the disclosure in any manner. In some embodiments, the devices 103 may form logic circuits for the BSI CIS.

An inter-layer dielectric (ILD) layer 105 is formed on a front side $101_f$ of the first substrate 101 and is designed to isolate the photosensitive elements 113 and the devices 102 from subsequently formed metallization layers. The ILD layer 105 may comprise silicon dioxide, low-K dielectric materials (materials having a dielectric constant lower than silicon dioxide), such as silicon oxynitride, phosphosilicate glass (PSG), borophosphosilicate glass (BPSG), fluorinated silicate glass (FSG), organosilicate glasses (OSG), SiOxCy, Spin-On-Glass, Spin-On-Polymers, silicon carbon material, compounds thereof, composites thereof, combinations thereof, or the like, deposited by any suitable method, such as spin-on, chemical vapor deposition (CVD), and plasma-enhanced CVD (PECVD), or the like. Porous versions of the above materials may also be used. These materials and processes are provided as examples and other materials and processes may be used.

Metallization layers 107 are formed over the ILD layer 105 and are designed to interconnect the photosensitive elements 113 and the devices 103 to form functional circuitry. While illustrated in FIG. 1 as a single layer, the metallization layers 107 are formed of alternating layers of dielectric and conductive material and may be formed through any suitable process (such as deposition, damascene, dual damascene, etc.). The precise number of metallization layers 107 is dependent upon the design of the first semiconductor device 100.

It should also be noted that one or more etch stop layers (not shown) may be positioned between adjacent layers, e.g., between the ILD layer 105 and the first substrate 101, between adjacent dielectric layers in the metallization layers 107, and the like. Generally, the etch stop layers provide a mechanism to stop an etching process when forming vias and/or contacts. The etch stop layers are formed of a dielectric material having a different etch selectivity from adjacent layers, e.g., the underlying first substrate 101 and the overlying ILD layer 105. In an embodiment, etch stop layers may be formed of SiN, SiCN, SiCO, CN, combinations thereof, or the like, deposited by CVD or PECVD techniques.

Referring further to FIG. 1B, a first passivation layer 109 is formed over the first semiconductor device 100. The first passivation layer 109 may consist of one or multiple layers comprising silicon dioxide, undoped silicon glass (USG), silicon oxynitride (SiON), phosphosilicate glass (PSG), SiN, compounds thereof, composites thereof, combinations thereof, or the like, deposited by any suitable method, such as spin-on, chemical vapor deposition (CVD), and plasma-enhanced CVD (PECVD), or the like. These materials and processes are provided as examples and other materials and processes may be used.

A first plurality of hybrid bonding pads 111 are formed in the first passivation layer 109 as illustrated in FIG. 1B. The first plurality of hybrid bonding pads 111 may comprise copper, silver, gold, tungsten, aluminum, or other suitable conductive materials, and may be deposited using PVD, CVD, PECVD, plating, or similar. The first plurality of hybrid bonding pads 111 are subsequently used to bond the first semiconductor device 100 to another semiconductor device as well as act as electric contacts between them. In addition, the first plurality of hybrid bonding pads 111 may comprise one or more barrier layers (not shown) to protect the first passivation layer 109 from diffusion and metallic poisoning. The barrier layer may comprise titanium, titanium nitride, tantalum, tantalum nitride, or other alternatives. The barrier layer may be formed using PVD, CVD, or the like.

In an embodiment, photolithography techniques may be used to pattern the first passivation layer 109 and form the first plurality of hybrid bonding pads 111. Generally, a photoresist layer (not shown) is formed over the first passivation layer 109 and then exposed to radiation such as ultraviolet light or an excimer laser through a reticle (not shown), in accordance with a desired pattern. A bake or cure operation may be performed, and a developer may be used to remove either the exposed or unexposed portions of the photoresist layer, depending on whether a positive or negative resist is utilized. Thus, a pattern that is used to form openings (not shown) in the first passivation layer 109 is formed in the photoresist layer.

The first passivation layer 109 is etched, for example, by an anisotropic dry etch process to remove exposed portions of the first passivation layer 109. In some embodiments, multiple etch processes may be utilized to etch through the various layers of the first passivation layer 109. Subsequently, the photoresist layer is removed using, for example, an ashing process in combination with a wet clean process.

Reference further to FIGS. 1A and 1B, a conductive material is deposited to fill the openings in the first passivation layer 109 and form the first plurality of hybrid bonding pads 111. The conductive material may comprise copper, silver, gold, tungsten, aluminum, and the like, and may be deposited using PVD, CVD, PECVD, plating, or similar. Subsequently, a planarization process, such as a chemical mechanical polishing (CMP) may be performed to remove excess portions of the barrier layer and the conductive material from an upper surface of the first passivation layer 109. The remaining conductive material in the openings of the first passivation layer 109 forms the first plurality of hybrid bonding pads 111.

In some embodiments, the first plurality of hybrid bonding pads 111 may be in electrical contact with the metallization layers 107 and may provide electrical connections to the photosensitive elements 113 and the devices 103 of the first semiconductor device 100. In other embodiments, some of the first plurality of hybrid bonding pads 111 may not provide electrical connections to the metallization layers 107. Such hybrid bonding pads are dummy bonding pads that are used in subsequent bonding process only and provide no electrical connectivity to the photosensitive elements 113 and the devices 103. In some embodiments, the first plurality of hybrid bonding pads 111 have a first height $H_1$ more than 2500 Å to allow larger grain sizes and to form stronger bonds during the subsequent bonding process.

Referring further to FIGS. 1A and 1B, the first semiconductor device 100 has a pixel array region 121 comprising the array of the photosensitive elements 113 and a signal region 123 surrounding the pixel array region 121. The signal region 123 comprises the logic circuits of the first semiconductor device 100. In some embodiments, the first plurality of hybrid bonding pads 111 may be grouped into a first group of hybrid bonding pads in the pixel array region 121 and a second group of hybrid bonding pads in the signal region 123. The first group of hybrid bonding pads may provide electrical connectivity to the photosensitive elements 113 of the first semiconductor device 100. In some embodiments, neighboring ones of the first group of hybrid bonding pads in the pixel array region 121 have a uniform pitch, as illustrated in FIG. 1A. In an embodiment, a first pitch $P_1$ between the neighboring ones of the first group of hybrid bonding pads in the pixel array region 121 may be between about 1.8 μm and about 20 μm.

The second group of hybrid bonding pads in the signal region 123 may provide electrical control signals to the logic circuits of the first semiconductor device 100. In some embodiments, neighboring ones of the second group of hybrid bonding pads in the signal region 123 may have a non-uniform pitch. In an embodiment, clusters of hybrid bonding pads 125 in the signal region 123 have a second pitch $P_2$, and hybrid bonding pads in the clusters of hybrid bonding pads 125 may have the first pitch $P_1$. In an embodiment, the second pitch $P_2$ may be between about 30 μm and about 200 μm.

In further reference to FIG. 1A, in an embodiment, the first plurality of hybrid bonding pads 111 in the pixel array region 121 and the signal region 123 may have a same size. For example, in an embodiment, the first plurality of hybrid bonding pads 111 have a first width $W_1$ between about 0.1 μm and about 5 μm as illustrated in FIG. 1. Persons skilled in the art should realize that a particular square shape of the first plurality of hybrid bonding pads 111 are used for illustrative purposes only and other shapes, such as a circle, may be used.

Uniform size of the first plurality of hybrid bonding pads 111 in the pixel array region 121 and the signal region 123 allows high quality and uniform bonding interfaces between bonded semiconductor devices as well as to minimize adverse effects during CMP processes, such as metal dishing and dielectric delamination.

As described in greater detail below the first plurality of hybrid bonding pads 111 are used to bond the first semiconductor device 100 to a second semiconductor device. In some embodiments, the second semiconductor device is an application-specific integrated circuit (ASIC) device. In other embodiments, the second semiconductor device may be a die/chip or a wafer manufactured using a CMOS process, a MEMS process, or any suitable process according to specifications of the second semiconductor device.

Figure 2A:
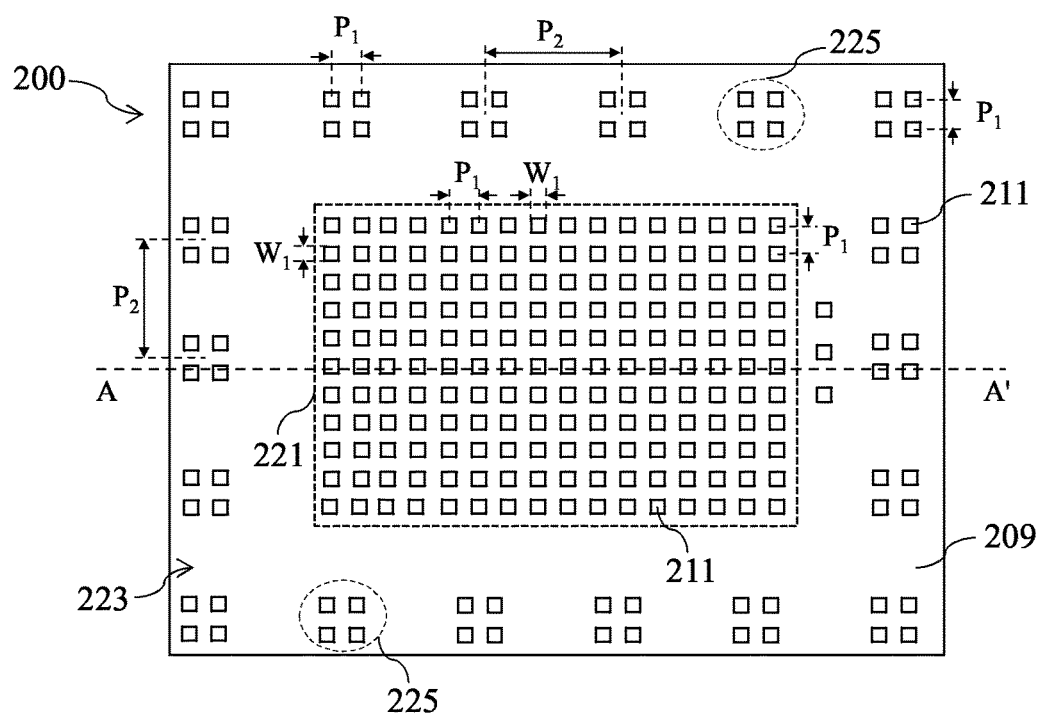
Figure 2B:
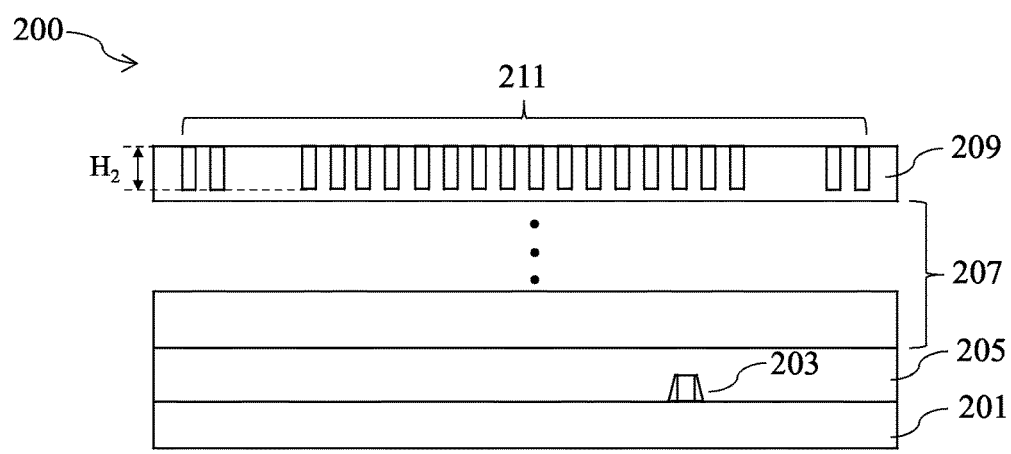

With reference to FIGS. 2A and 2B, there are shown top and cross-sectional views (through the line AA' in FIG. 2A), respectively, of a second semiconductor device 200 in accordance with some embodiments. In some embodiments, the first semiconductor device 100 and the second semiconductor device 200 may be formed using same manufacturing processes, and unless noted otherwise, reference numerals "2xx" of FIGS. 2A and 2B refer to the same features and processes as reference numerals "1xx" of FIGS. 1A and 1B.

Referring further to FIGS. 2A and 2B, a second plurality of hybrid bonding pads 211 are formed in a second passivation layer 209 using methods and materials similar to those used to form the first plurality of hybrid bonding pads 111 as discussed above with reference to FIGS. 1A and 1B. In addition, the second plurality of hybrid bonding pads 211 and the first plurality of hybrid bonding pads 111 have similar structure and geometry as illustrated in FIGS. 1A and 2A. In some embodiments, the second plurality of hybrid bonding pads 211 have a second height $H_2$ of more than 2500 Å to allow larger grain sizes and to form stronger bonds during the subsequent bonding process.

Figure 3:
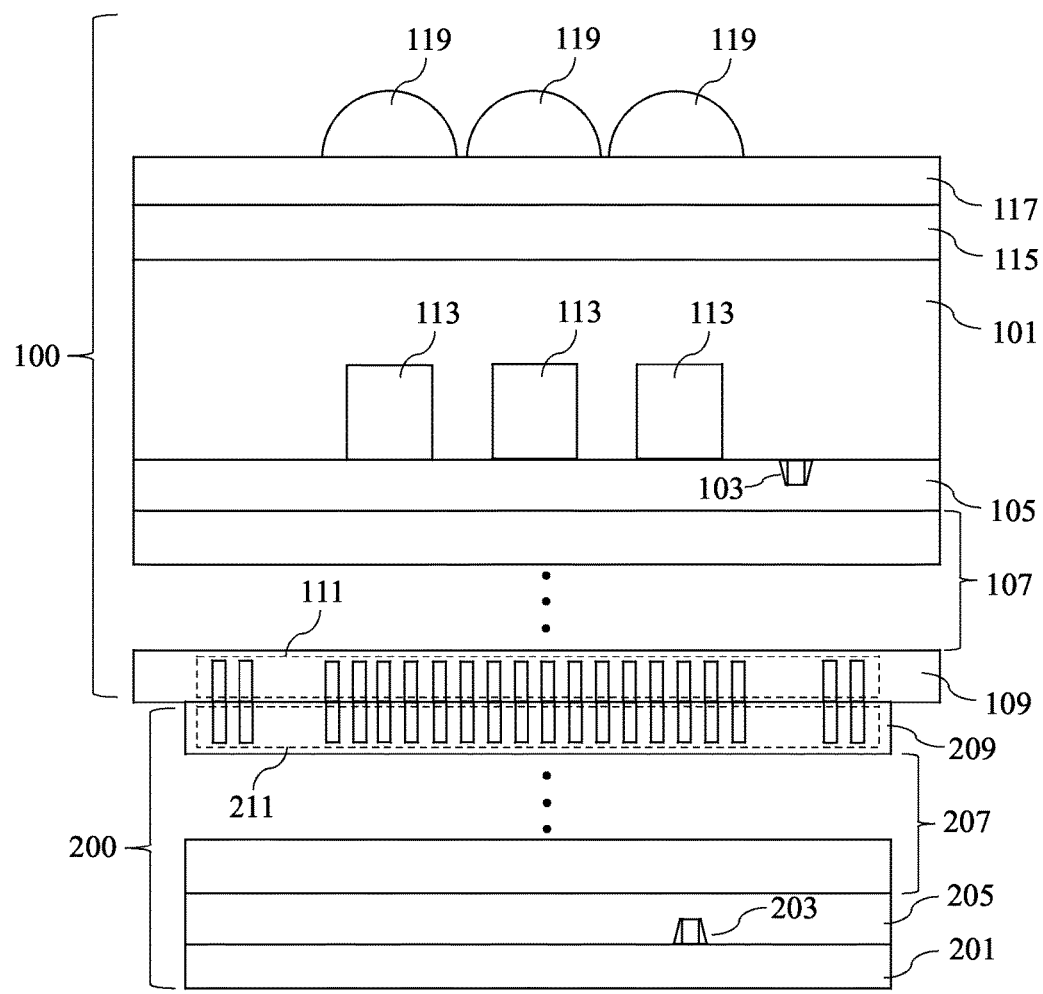

Referring to FIG. 3, the first semiconductor device 100 is bonded to the second semiconductor device 200 in accordance to some embodiments. Prior to bonding, surface cleaning and surface activation of the first semiconductor device 100 and the second semiconductor device 200 are performed to prepare the first semiconductor device 100 and the second semiconductor device 200 for bonding. The surface cleaning is performed to remove CMP slurry and native oxide layers from surfaces of the first semiconductor device 100 and the second semiconductor device 200. Subsequently, the surface activation may be performed to prepare the first semiconductor device 100 and the second semiconductor device 200 for bonding. The surface activation process may include suitable processes, such as plasma etch or wet etch processes to remove native oxides, which may be formed after the wafer cleaning process, from the surfaces of the first semiconductor device 100 and the second semiconductor device 200.

The first semiconductor device 100 may be bonded to the second semiconductor device 200 using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding (e.g., simultaneous metal-to-metal and dielectric-to-dielectric bonding), any combinations thereof and/or the like. For example, the first semiconductor device 100 and the second semiconductor device 200 are bonded using hybrid bonding, by bonding the first plurality of hybrid bonding pads 111 and the first passivation layer 109 of the first semiconductor device 100 to the second plurality of hybrid bonding pads 211 and the second passivation layer 209 of the second semiconductor device 200. Subsequently, optional annealing may be performed to enhance the bonding strength between the semiconductor devices. It should be noted that the bonding may be at wafer level, the die-to-die level, or the die-to-wafer level.

Figure 4:
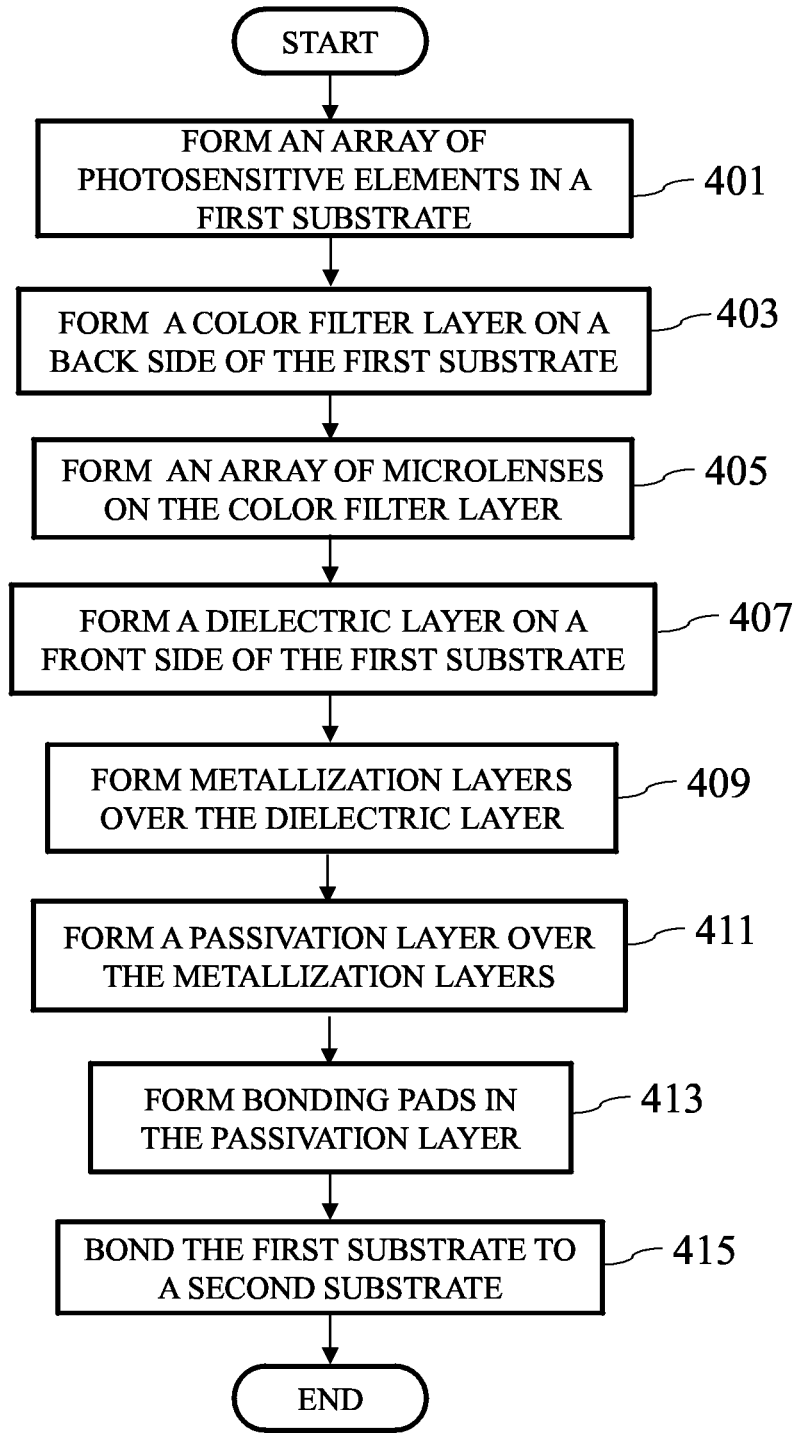
FIG. 4 is a flowchart illustrating a semiconductor device fabrication method in accordance with some embodiments.

FIG. 4 is a flowchart illustrating a method that may be performed to manufacture a semiconductor device comprising an image sensor in accordance with some embodiments. The method begins at step 401, wherein an array of photosensitive elements is formed in a first substrate as discussed above with reference to FIG. 1B. In step 403, a color filter layer is formed on a back side of the first substrate as discussed above with reference to FIG. 1B. An array of microlenses is formed on the color filter layer during step 405 as discussed above with reference to FIG. 1B. In step 407, a dielectric layer is formed on a front side of the first substrate as discussed above with reference to FIG. 1B. Metallization layers are formed on the dielectric layer during step 409 as discussed above with reference to FIG. 1B. In step 411, a passivation layer is formed over the metallization layers as discussed above with reference to FIG. 1B. In step 413, uniform-size bonding pads are formed in a pixel array region and a signal region of the passivation layer as discussed above with reference to FIGS. 1A and 1B. Finally, in step 415, the first substrate is bonded to a second substrate as illustrated in FIG. 3.

In an embodiment, a semiconductor device comprises a first substrate, a first passivation layer over the first substrate, and a first plurality of bonding pads in the first passivation layer, the first plurality of bonding pads representing a pixel array region, the first plurality of bonding pads having a first width and a first pitch. The semiconductor device further comprises a second plurality of bonding pads in the first passivation layer, the second plurality of bonding pads providing electrical control signals, the second plurality of bonding pads having the first width.

In another embodiment, a semiconductor device comprises an image sensor comprising a first substrate having a plurality of photosensitive elements therein, a first passivation layer over the first substrate, and a first plurality of bonding pads in the first passivation layer, the first plurality hybrid of hybrid bonding pads representing output signals from the plurality of photosensitive elements, the first plurality of hybrid bonding pads having a first width and a first pitch. The image sensor further comprises a second plurality of bonding pads in the first passivation layer, the second plurality of bonding pads providing control signals, the second plurality of bonding pads having the first width. The semiconductor device further comprises a second substrate bonded to the image sensor, the second substrate comprising a second passivation layer over the second substrate, and a third plurality of hybrid bonding pads in the second passivation layer. The second substrate is directly bonded to the image sensor such that the first plurality of bonding pads and the second plurality of bonding pads are aligned with respective ones of the third plurality of bonding pads.

In yet another embodiment, a method of fabricating a semiconductor device, the method comprises providing a first substrate having a plurality of photosensitive elements, forming a first passivation layer over the first substrate, and forming a first plurality of bonding pads in the first passivation layer, the first plurality of bonding pads providing outputs representative of the photosensitive elements, the first plurality of bonding pads having a first width and a first pitch. The method further comprises forming a second plurality of bonding pads in the first passivation layer, the second plurality of bonding pads providing control signals, the second plurality of bonding pads having the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   providing a first substrate having a plurality of photosensitive elements;
   forming a first passivation layer over the first substrate;
   forming a first plurality of bonding pads in the first passivation layer, the first plurality of bonding pads providing outputs representative of the photosensitive elements, the first plurality of bonding pads having a first width and a first pitch; and
   forming a second plurality of bonding pads in the first passivation layer, the second plurality of bonding pads providing control signals, the second plurality of bonding pads having the first width.

2. The method of claim 1, wherein the first width is between about 0.1 μm and about 5 μm.

3. The method of claim 1, wherein the first plurality of bonding pads and the second plurality of bonding pads have a height greater than 2500 Å.

4. The method of claim 1, wherein the first pitch is between about 1.8 μm and about 20 μm.

5. The method of claim 1, wherein the second plurality of bonding pads are grouped into clusters, the second plurality of bonding pads having a second pitch between neighboring clusters and the first pitch between adjacent bonding pads in a first cluster, the first pitch being between about 1.8 μm and about 20 μm, and the second pitch being between about 30 μm and about 200 μm.

6. The method of claim 1, further comprising:
   providing a second substrate;
   forming a second passivation layer over the second substrate;
   forming a third plurality of bonding pads in the second passivation layer; and
   bonding the first substrate to the second substrate using a hybrid bonding method.

7. The method of claim 1, wherein the first plurality of bonding pads have a uniform dishing profile.

8. A method comprising:
forming an image sensor comprising:
depositing a first passivation layer over a first substrate, the first substrate having a plurality of photosensitive elements therein;
forming a first plurality of bonding pads in the first passivation layer, the first plurality of bonding pads having a first width and a first pitch; and
forming a second plurality of bonding pads in the first passivation layer, the second plurality of bonding pads having the first width, the first plurality of bonding pads being in an interior region of the first substrate and the second plurality of bonding pads being in a peripheral region of the first substrate;
forming a second substrate comprising:
forming a second passivation layer over a second substrate; and
forming a third plurality of hybrid bonding pads in the second passivation layer; and
bonding the second substrate is to the image sensor such that the first plurality of bonding pads and the second plurality of bonding pads are coupled with respective ones of the third plurality of bonding pads.

9. The method of claim 8, wherein the first width is between about 0.1 µm and about 5 µm.

10. The method of claim 8, wherein the first plurality of bonding pads, the second plurality of bonding pads, and the third plurality of bonding pads have a height greater than 2500 Å.

11. The method of claim 8, wherein the second plurality of bonding pads are grouped into clusters, the second plurality of bonding pads having a second pitch between neighboring clusters and the first pitch between adjacent bonding pads in a first cluster, the first pitch being smaller than the second pitch.

12. The method of claim 8, wherein bonding the second substrate is to the image sensor comprises a hybrid bonding method.

13. The method of claim 8, wherein after the bonding, the first passivation layer contacts the second passivation layer.

14. The method of claim 8, wherein the first plurality of bonding pads provide outputs representative of the photosensitive elements, and wherein the second plurality of bonding pads provide control signals.

15. A method comprising:
forming an image sensor comprising:
depositing a first passivation layer over a first substrate, the first substrate having a plurality of photosensitive elements therein;
forming a first plurality of bonding pads in the first passivation layer, the first plurality of bonding pads having a first width and a first pitch; and
forming a second plurality of bonding pads in the first passivation layer, the second plurality of bonding pads having the first width, the second plurality of bonding pads being grouped into clusters, the second plurality of bonding pads having a second pitch between neighboring clusters and the first pitch between adjacent bonding pads in a first cluster, the first pitch being smaller than the second pitch;
forming a second substrate comprising:
forming a second passivation layer over a second substrate; and
forming a third plurality of hybrid bonding pads in the second passivation layer; and
bonding the second substrate is to the image sensor such that the first plurality of bonding pads and the second plurality of bonding pads are coupled with respective ones of the third plurality of bonding pads.

16. The method of claim 15, wherein the first plurality of bonding pads are in an interior region of the first substrate and the second plurality of bonding pads are in a peripheral region of the first substrate.

17. The method of claim 15, wherein bonding the second substrate is to the image sensor comprises a hybrid bonding method.

18. The method of claim 15, wherein after the bonding, the first passivation layer contacts the second passivation layer.

19. The method of claim 15, wherein the first width is between about 0.1 µm and about 5 µm.

20. The method of claim 15, wherein the first plurality of bonding pads provide outputs representative of the photosensitive elements, and wherein the second plurality of bonding pads provide control signals.

* * * * *